(12) United States Patent
Xia et al.

(10) Patent No.: US 6,426,015 B1
(45) Date of Patent: Jul. 30, 2002

(54) METHOD OF REDUCING UNDESIRED ETCHING OF INSULATION DUE TO ELEVATED BORON CONCENTRATIONS

(75) Inventors: Li-Qun Xia, Santa Clara; Francimar Campana, Milpitas; Ellie Yieh, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/461,504

(22) Filed: Dec. 14, 1999

(51) Int. Cl.$^7$ ................................................. B44C 1/22
(52) U.S. Cl. .................. 216/62; 216/67; 134/22.1; 438/424; 438/428; 438/433; 438/778; 438/783; 438/789
(58) Field of Search .................. 216/62, 67; 134/22.1; 438/426, 428, 433, 778, 787, 783, 789

(56) References Cited

U.S. PATENT DOCUMENTS 5,879,574 A * 3/1999 Sivaramakrishnan et al. . 216/60
5,976,900 A * 11/1999 Qiao et al. ..................... 438/14
6,218,268 B1 * 4/2001 Xia et al. ..................... 438/435

* cited by examiner

*Primary Examiner*—Randy Gulakowski
*Assistant Examiner*—M. Kornakov
(74) *Attorney, Agent, or Firm*—Townsend and Townsend and Crew

(57) ABSTRACT

A method is provided for reducing elevated boron concentrations (denoted as "boron spikes") in an insulating layer containing silicon, boron and other elements where the layer interfaces with surfaces of a semiconductor device. The method includes the steps of: seasoning a reaction chamber by flowing into it a mixture of gasses containing silicon, boron, ozone and other elements in predetermined proportions under set conditions of time, pressure, temperature and flow rates to deposit on inner walls and surfaces of the chamber a thin seasoning coating, and placing a semiconductor device in the chamber and covering it with an insulating layer having a composition similar to the seasoning coating. Subsequent etching of selected portions of the insulating layer has been found not to expose conductive surfaces of the device.

7 Claims, 1 Drawing Sheet

METHOD OF REDUCING UNDESIRED ETCHING OF INSULATION DUE TO ELEVATED BORON CONCENTRATIONS

FIELD OF THE INVENTION

This invention relates to a method for reducing, during processing of semiconductors, excessive etching-away of portions of glass-like layers of insulation, the insulation typically being a fused compound of silicon, boron, and other elements. Such defective etching is caused by elevated concentrations of boron where the insulation interfaces with or touches portions of a semiconductor device, namely, conductive elements of the device and the insulated substrate of a chip upon which the device is formed.

BACKGROUND OF THE INVENTION

In recent years the density of semiconductor devices has increased greatly. There are now commercially available dynamic random access memories (DRAMS) with as many as 256 megabit memory elements on a single small chip of silicon. There will be available in the near future devices with as many as a gigabit of active elements per chip. Such high density has resulted in certain problems, not only in design, but in the manufacturing of the devices.

Among the steps to which a silicon wafer is subjected in the course of processing into devices, such as high density DRAMs, is the step of applying to the devices a layer or layers of high temperature insulation. Typically, a thin glass-like layer containing silicon and other elements is used as the insulation. In the case of high density DRAMS, for example, the spaces separating one memory cell from another on the chip can be as narrow as a small fraction of a micron in DRAMs now in production. The depth perpendicular to the face of the chip of such narrow spaces can be great enough that it becomes difficult to fully fill them with insulation free of voids.

A conventional way of applying insulation to semiconductor devices is to deposit silicon dioxide ($SiO_2$) using chemical vapor deposition (CVD) onto the devices within a reaction chamber containing a gaseous mixture of tetraethylorthosilicate (TEOS) and ozone. As the film grows over the topographical surface, having spaces or gaps between elements of devices, the film thus fills the gaps. However, due to the nature of the reaction mechanism, the top surfaces of these gaps tend to receive more incoming reactant and thus higher growth rates, compared to the bottom portions. Therefore, voids tend to develop during the CVD process because of the greater depth-to-width ratio of the spaces in high-density semiconductor devices (e.g. gigabit DRAMS). To eliminate this difficulty TEOS is mixed in suitable proportion with triethylborate (TEB) and triethylphosphate (TEPO), as is well known in the art. The voids in insulation previously encountered are eliminated by the more "flowable" mixture of silicon, phosphorus and boron. But such an insulating layer in a thin zone where it touches or interfaces with bare surfaces of semiconductor elements (e.g., memory cells) of a device or with a dielectric layer, contains a much higher concentration of boron than contained elsewhere in the insulation. Thereafter when portions of insulation are selectively etched away using buffered hydrofluoric acid (BHP), as conventionally used in the art, the acid too aggressively attacks the boron-rich zones of the insulation at the interface surfaces. This condition results in undesirable under cutting (or excessive etching away) of these boron-rich zones. This in turn exposes or lays bare conductive portions of elements of the device. When metal conductors are subsequently applied to the etched devices in a metalizing step, electrical short-circuits can occur. This clearly is an unacceptable condition.

It is desirable to substantially eliminating such boron-rich zones in the insulation layers, and minimizes defective etching of these layers and the electrical short-circuits resulting therefrom.

SUMMARY OF THE INVENTION

The present invention is directed to a method for substantially eliminating zones of elevated boron concentrations (termed hereinafter "boron-spikes") in insulation layers where they touch or interface with surfaces of elements (e.g., memory cells) and the substrate of a semiconductor device. Substantial elimination of "boron-spikes" reduces defective etching of such insulation layers prior to application to the device of metalized layers (electrical conductors) and possible electrical short-circuits.

Before applying insulation to the surfaces of semiconductors within a reaction chamber, it has been customary prior to the present invention to clean the chamber of residues of chemicals left over from a previous processing step. Then a semiconductor wafer is placed in the chamber and insulation is formed via CVD reaction of tetraethylorthosilicate (TEOS), triethylborate (TEB), triethylphosphate (TEPO) and ozone, as is well known in the art.

In accordance with the present invention, a clean reaction chamber, before a semiconductor wafer is placed into it, is "seasoned", or pre-conditioned by a step of introducing into the chamber the same general kind of insulating compound (i.e., a mixture of TEOS, TEB and TEPO) as also applied later to semiconductors on a wafer, and under similar conditions of times, temperatures, pressures and concentrations.

By way of example, a clean reaction chamber (without a wafer) is "seasoned" in a specific embodiment of the invention by the following conditioning treatment. This comprises flowing into the chamber at ambient temperature and a pressure of about 400 Torr and above, the following mixture of gasses: TEOS at 800 milligrams per minute (mgm), while keeping other gasses flowing at normal rates, e.g. TEB=120 mgm, TEPO=50 mgm, and $O_3$=4000 sccm −12 wt. %. For convenience, we can pick similar flow rates as the actual deposition conditions. The total "seasoning" time is about 60 sec. Such a "seasoning" step tends to passivate the inner walls of the chamber and reduce surface absorption of the reactants during deposition, and leaves on the walls a thin oxide coating to a suitable thickness (e.g., a faction of a micron). Thereafter a semiconductor wafer is inserted into the now "seasoned" chamber and insulation is applied to the devices on the wafer by a closely similar process using materials, times, and conditions such as utilized in the previous chamber "seasoning" treatment. The insulation deposited onto the devices is reflowed by heating the devices to a suitably high temperature, as is well known. In this way boron-spikes in the insulating layers formed on the semiconductor devices are substantially eliminated and resulting defects in subsequent etching of the layers are essentially avoided. Of course, exact times, chemical proportions, pressures, etc. in forming insulating layers on semiconductor devices will depend on the needs of the particular devices then being insulated.

(Claim 1) Viewed from a first aspect, the present invention is directed to a method for reducing boron concentrations in an insulating layer containing silicon, boron and other elements where the layer interfaces with surfaces of a semiconductor wafer. The method comprises the steps of: seasoning a reaction chamber by flowing into it a mixture of gasses comprising silicon, boron, phosphorous, and in predetermined proportions under set conditions of time, pressure, temperature and flow rates to passivate the inner walls and surfaces of the chamber with a thin oxide deposition seasoning coating; and placing a semiconductor wafer in the chamber and covering it with an insulating layer having a composition similar to the seasoning coating such that boron spiking is reduced and subsequent etching of selected portions of the insulating layer does not expose conductive surfaces of devices formed in and/or on the semiconductive wafer which are not desired to be exposed.

(Claim 5) Viewed from a second aspect, the present invention is directed to a method for reducing boron concentrations in and defective etching resulting therefrom of an insulating layer containing boron and phosphorus doped silicon oxide where the layer interfaces with a surfaces of a surface of a semiconductor wafer. The method comprises the steps of: seasoning a reaction chamber by flowing into it a mixture of gasses comprising silicon, boron, phosphorus, and ozone in predetermined proportions under set conditions of time, pressure, temperature and flow rates to deposit on inner walls and surfaces of the chamber a thin seasoning coating; placing a semiconductor wafer in the chamber and depositing on it an insulating layer of boron-phosphorus-silicon-glass (BPSG) having a composition similar to the seasoning coating, and a thickness less than a micron, the average concentration of boron down through the BPSG layer being approximately constant, the BPSG layer covering devices formed in and/or on the semiconductor wafer substantially without voids in preparation for the application of metalized conductors to the semiconductor wafer; and etching away selected portions of the BPSG insulating layer in preparation for the application of metalized conductors to the devices while leaving conductive surfaces of the semiconductor wafer remaining covered by the BPSG layer so as to avoid electrical short-circuits to the metalized conductors.

A better understanding of the invention together with a fuller appreciation of its many advantages will best be gained from a study of the following description given in connection with the accompanying drawings and claims.

The drawings are not necessarily shown to scale.

DETAILED DESCRIPTION

Figure 1:
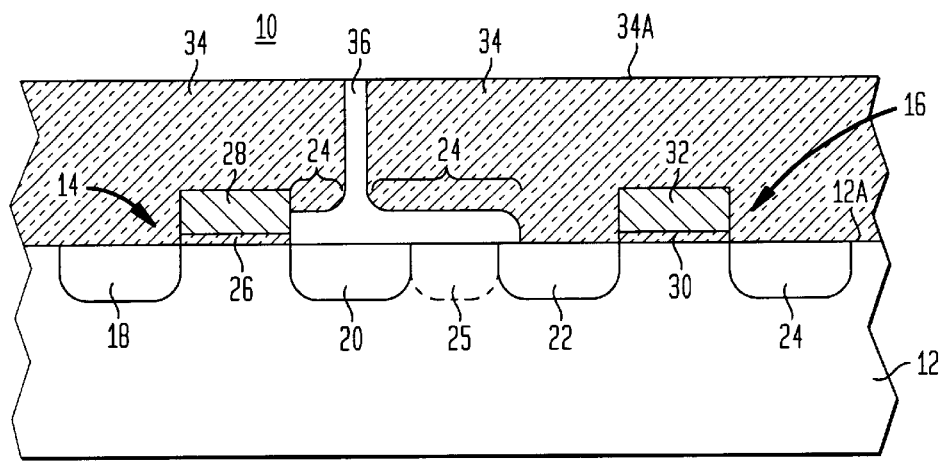
FIG. 1 shows a schematic cross-section of a portion of a semiconductor wafer in and on which two field effect transistors have been formed with an etched via which illustrates a problem which the present invention is directed to solving.

Referring now to FIG. 1 there is shown a schematic illustration, in cross-section of a portion of a semiconductor wafer 10 having a substrate (body) 12 with a surface 12A. Field effect transistors 14 and 16 are formed in substrate 12 and on surface 12A. Transistor 14 comprises a drain region 18 and a source region 20 which are separated by a portion of substrate 12. Located on surface 12A is a gate dielectric layer 26 which is above and covers the portion of substrate 12a which separates drain region 18 from source region 20. A conductive gate layer 28 covers gate dielectric layer 26. Conductive Layer 28 can be doped polysilicon or metal. Transistor 16 is essentially identical to transistor 14 and comprises drain region 22, source region 24, a gate dielectric layer 30, and a conductive gate layer 32. Source region 20 of transistor 14 is separated from transistor 16 by a portion of substrate 12 and optionally by a dielectric region 25 (shown in dashed lines) formed in the portion of substrate 12 between transistors 14 and 16. Overlying transistors 14 and 16 and surface 12A is an insulating layer 34, which has a top surface 34A, through which has been etched a via 36 down to surface 12A.

The transistors 14 and 16, which may be transistors forming part of a high density DRAM, can be very closely spaced together. Horizontal spacing between transistors 14 and 16 may be as small as a small fraction of a micron wide and the vertical depth from surface 34A to surface 12A can and typically is a number of times greater than this amount. This great depth-to-width ratio makes it difficult to fill the spaces between transistors 14 and 16 with insulation free of voids. Using only tetraethylorthosilicate (TEOS) in conventional fashion produces insulation which when annealed below 950° C. is not sufficiently "flowable" to always fill the deep narrow spaces between transistors 14 and 16 and other transistors (not shown) and devices (not shown) of the device 10. Accordingly, a mixture of TEOS with added amounts of triethylborate (TEB) and triethylphosphate (TEPO) is preferred to produce the insulating layer 34 since such insulation is sufficiently flowable when melted to fill the spaces between transistors 14 and 16 and other transistors and devices of wafer 10.

The insulating layer 34, by way of further explanation of the invention, is shown having been applied to the wafer 10 in a reaction chamber not previously "seasoned" to illustrate the problem of elevated boron concentrations (boron-spikes) in the insulation where it touches or interfaces with surface 12A. These boron-spikes, when the insulating layer 34 is thereafter selectively etched to provide for the addition of metal conductors to, for example, the source of transistor 14, result in defective etching of the insulating layer 34 where it touches surface 12A, as will be further explained below.

The insulating layer 34 is advantageously applied to the wafer 10, in one specific example, by flowing into a reaction chamber (not shown) at ambient temperature and a pressure of about 600 Torr (T) the following mixture of gasses: TEOS at 250 milligrams per minute (MGM), TEB at 112 mgm, TEPO at 50 mgm, and 4 liters per minute of helium mixed with 12.5% by weight of ozone. This flow of gasses into the chamber lasts for about 120 seconds. The pressure is then reduced to about 200T while increasing the flows of TEOS to 600 mgm, TEB to 160 mgm, and TEPO to 70 mgm, and with the same flow of helium and ozone, for about another 80 seconds. The insulation deposited on the wafer 10 is fused into boron-phosphorus-silicon-glass (BPSG) by heating it to a suitably high temperature, as is well known. The insulating layer 34 thus deposited on the wafer 10 is void-free and has a thickness of about 0.6 micron in this specific example.

A conventional way of etching insulation such as the insulating layer 34, is to use buffered hydrofluoric acid (BHP) under conditions of temperature, time, concentration, etc., well known in the art. The insulating layer 34 is shown with a via (opening) 36 extending from a top surface 36A thereof down to surface 12A. Via 36 is typically formed by use of the etchant BHP. In via 36, boron concentration in the layer 34 near top surface 34A and down to close to surface 12A is not elevated and the walls of via 36 are essentially parallel until they reach close to surface 12A. However, because of boron-spikes in the insulating layer 34 near where it touches the surface 12A, the lower end of via 36 is etched away laterally (sideways), or undercut as indicated by brackets 24. This undercutting of layer 34 at 24 constitutes seriously defective etching of the via 36. The undercutting at 24 is shown extending to and laying bare small portions indicated of the gate layer 28 and the drain region 22 of transistor 16. The undercutting of insulation layer 34 at 24 is caused by too aggressive etching-away by the etchant BHP of insulating layer 34 where it has boron concentrations elevated above the average. When a metalized layer (not shown) is subsequently applied to fill the via 36 to provide an electrical conductor to the source of transistor 14, the metalized layer can contact the gate layer 28 of transistor 14 as well as the drain region 22 of transistor 16. This could electrically short the gate layer 28 and drain region 20 of transistor 14 to the source region 22 of transistor 16. This problem is avoided by the present invention which provides for "seasoning" or pre-conditioning of the processing chamber prior to applying the insulating layer 34 onto the wafer 10. "Seasoning" of the chamber inhibits the subsequent formation of boron-spikes in the insulation of a semiconductor device, as was previously explained. This in turn effectively prevents undercutting of subsequently formed insulation layer 34 at the lower ends of the via 36, as indicated by brackets 24. Using the inventive method results in the sides of the via 36 remaining substantially vertical down to the surface 12A. This leaves surfaces of the transistors 14 and 16 that are not to be contacted by metal deposited in via 36 still covered by portions of the insulating layer 34.

Figure 2:
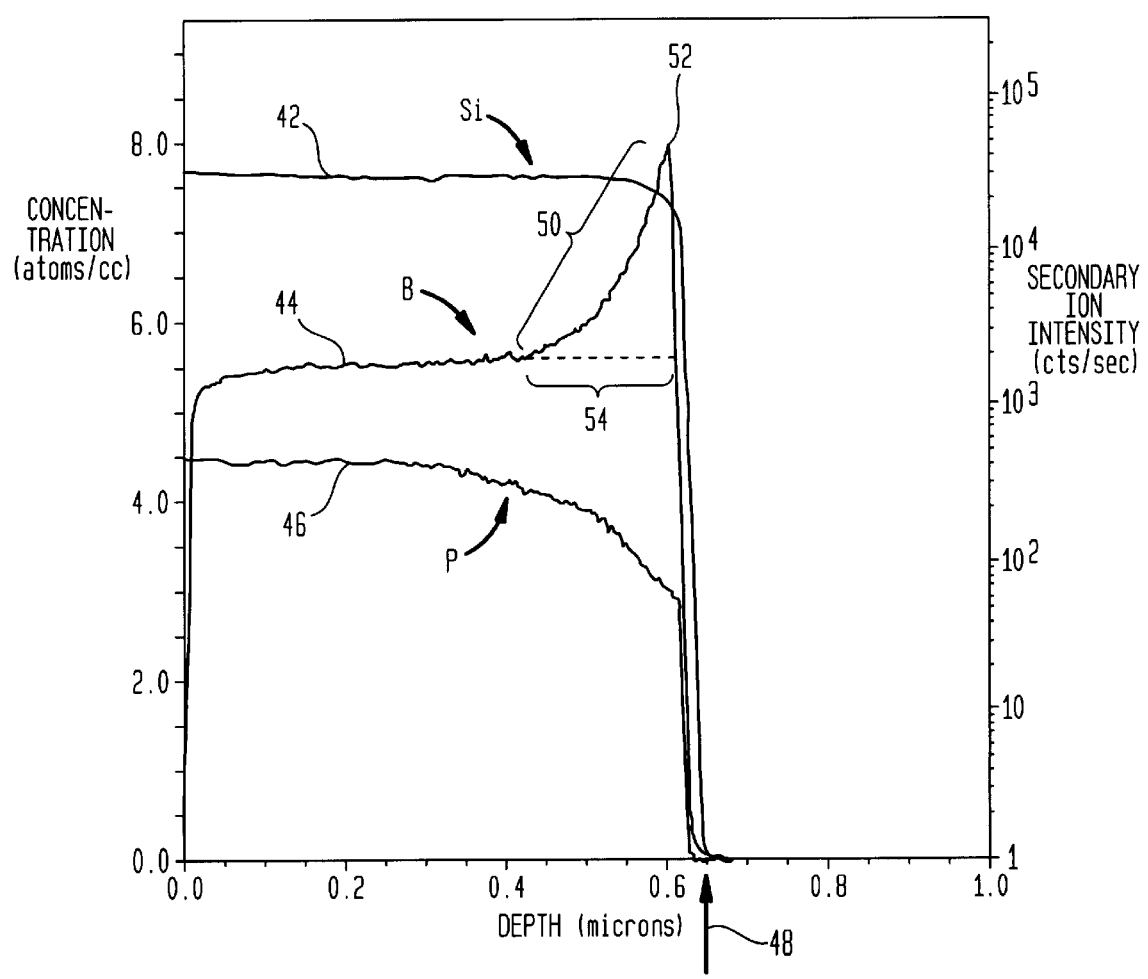
FIG. 2 is a graph of relative concentrations of silicon (Si), boron (B), and phosphorus (P) on a major surface of the semiconductor wafer of FIG. 1, with a left-side vertical axis showing normalized values of concentrations of these elements in atoms per cc, a right-side vertical axis showing secondary ion intensity in counts/sec., and a horizontal axis showing depth in microns into the insulating layer in a direction perpendicular to the semiconductor wafer.

Referring now to FIG. 2, there is shown a graph 40 giving measured concentrations of the elements silicon (Si), boron (B), and phosphorus (P) in the insulation layer 34 of the wafer 10 (see FIG. 1). The graph 40 has a left-side vertical axis showing normalized values of concentrations of these elements in atoms per cc., a right-side vertical axis showing secondary ion intensity in counts/sec., and a horizontal axis showing depth in microns in the insulating layer 34 from its top surface 34A down to the surface 12A. This corresponds to the depth of a via 36 shown in FIG. 1. The graph 40 comprises a first curve 42 showing concentration of silicon atoms as a function of depth into the insulation layer 34 of FIG. 1, a second curve 44 showing concentration of boron atoms as a function of depth into the insulation layer 34, and a third curve 46 showing concentration of phosphorus atoms as a function of depth into the insulation layer 34. The curves 42, 44, and 46 show measurements made by secondary ion mass spectroscopy (SIMS), a technique well known in the art.

The curve 42 shows that the concentration of silicon remains substantially constant from the top (zero depth) down into the insulating layer 34 until a depth of slightly more than 0.6 micron is reached, corresponding to the surface 12A and here indicated by an arrow 48. The curve 44 shows that the concentration of boron remains substantially constant from the top down into the insulating layer 34 until a depth of approximately 0.4 micron is reached. Then as indicated by a bracketed portion 50 of the curve 44, the concentration of boron rapidly increases to a value indicated at 52 where depth into the insulating layer 34 reaches down to the surface 12A. At the value 52, the boron concentration actually, in this example, exceeds the concentration of silicon. The portion 50 of the curve 44 corresponds to a boron-spike in the insulating layer 34. By "seasoning" the reaction chamber, the boron-spike is effectively eliminated. SIMS measurements taken of the insulation on a wafer (substantially identical to the wafer 10) show that after "seasoning", the previous curve 44 of boron concentration after a depth into the insulation of about 0.4 micron continues instead substantially along a dashed-line horizontal bracketed portion 54 to the depth of about 0.6 micron indicated by the arrow 48. The curve 46 showing the concentration of phosphorus remains substantially unchanged after "seasoning", as does the curve 42 for silicon.

It is not completely understood why the "seasoning" (i.e., forming of an insulating layer like layer 34) of the walls of the reaction chamber prior to forming the insulating layer 34 on the semiconductor wafer 10 does achieve the desired result of reducing excessive lateral etching. The best present theory is that when the walls of the reaction chamber are not "seasoned" with their own insulating layer, like layer 34, before the formation of the insulating layer 34 on semiconductor wafer 10, the walls may tend to absorb more phosphorous than boron and thus cause excess boron to be available for incorporation into the layer 34 being formed on semiconductor wafer 10.

The above description is intended in illustration and not in limitation of the invention. Various minor changes in the examples set forth may occur to those skilled in the art and can be made without departing from the spirit and scope of the invention as set forth in the accompanying claims. For example, the invention is not limited to a particular kind of semiconductor device, or to the exact processing conditions and parameters set forth.

What is claimed is:

1. A method for reducing boron concentrations in an insulating layer, comprising the steps of:
    seasoning a reaction chamber by flowing into it a first mixture of gases comprising silicon, boron, phosphorus, and in predetermined proportions under set conditions of time, pressure, temperature and flow rates to passivate the inner walls and surfaces of the chamber with a thin oxide deposition seasoning coating; and
    placing a semiconductor wafer in the chamber and covering it with an insulating layer comprising silicon, boron, and phosphorus such that boron spiking is reduced and subsequent etching of selected portions of the insulating layer does not expose conductive surfaces of devices formed in and/or on the semiconductive wafer which are not desired to be exposed.

2. The method of claim 1 wherein the insulating layer on the device is fused into boron-phosphorus-silicon-glass (BPSG) such that voids and empty spaces in the insulation are avoided.

3. The method of claim 2 wherein the insulating layer of BPSG has average proportions of atoms of silicon to boron to phosphorus of roughly 8 to 6 to 4.

4. The method of claim 3 wherein the BPSG layer is 0.6 micron thick, and the average concentration of boron through the thickness of the layer is approximately constant.

5. A method for reducing boron concentrations in an insulating layer comprising the steps of:
    seasoning a reaction chamber by flowing into it a mixture of gasses comprising silicon, boron, phosphorus, and ozone in predetermined proportions under set conditions of time, pressure, temperature and flow rates to deposit on inner walls and surfaces of the chamber a thin seasoning coating;

placing a semiconductor wafer in the chamber and depositing on it an insulating layer of boron-phosphorus-silicon-glass (BPSG) of a thickness less than a micron, the average concentration of boron down through the BPSG layer being approximately constant, the BPSG layer covering devices formed in and/or on the semiconductor wafer substantially without voids in preparation for the application of metalized conductors to the semiconductor wafer; and etching away selected portions of the BPSG insulating layer in preparation for the application of metalized conductors to the devices while leaving conductive surfaces of the semiconductor wafer remaining covered by the BPSG layer so as to avoid electrical short-circuits to the metalized conductors.

6. The method of claim 5 wherein seasoning of the reaction chamber is accomplished by flowing into the chamber a gaseous mixture of tetraethylorthosilicate (TEOS), triethylborate (TEB), triethylphosphate (TEPO) and ozone in an inert gas under predetermined conditions of times, temperatures, pressures and concentration.

7. The method of claim 6 wherein the BPSG layer has average proportions of atoms of silicon to boron to phosphorus of roughly 8 parts to 6 parts to 4 parts.

* * * * *